United States Patent [19]
Grabow

[11] Patent Number: 5,117,554
[45] Date of Patent: Jun. 2, 1992

[54] TAB ROUTING METHOD AND APPARATUS

[75] Inventor: Glen M. Grabow, Pendelton, Ind.

[73] Assignee: Cencorp, Inc., Longmont, Colo.

[21] Appl. No.: 681,453

[22] Filed: Apr. 4, 1991

Related U.S. Application Data

[63] Continuation of Ser. No. 440,337, Nov. 22, 1989, abandoned.

[51] Int. Cl.⁵ .............................................. B23P 19/00
[52] U.S. Cl. ........................................ 29/791; 29/822; 83/167; 83/415; 83/451; 414/416
[58] Field of Search ....................... 29/403.3, 412, 414, 29/426.3, 791, 822; 414/416; 83/23, 109, 167, 415, 451

[56] References Cited

U.S. PATENT DOCUMENTS

| | | | |
|---|---|---|---|
| 902,767 | 11/1908 | Sheldon | 29/412 X |
| 2,583,940 | 1/1952 | Furlong | 83/23 |
| 2,618,311 | 11/1952 | Parker | 83/23 X |
| 4,946,340 | 8/1990 | Murphy et la. | 414/416 X |

*Primary Examiner*—Joseph M. Gorski
*Attorney, Agent, or Firm*—Wegner, Cantor, Mueller & Player

[57] ABSTRACT

A method and apparatus are disclosed for handling multi-board panels in order to liberate therefrom individual circuit boards which may or may not have been prepopulated with the electrical components. Each panel is supported above a receiving tray on a top shuttle and transported from a load/unload station to a routing station at which tabs or webs which retain the circuit boards in the panel are removed. Removal of the boards is facilitated by X-positioning of the panel and Y-positioning of the router according to a programmable controller. The tray receives liberated boards from the top shuttle which is then cycled back to the load/unload station for unloading scrap, acquiring another tray, and reloading the shuttle with another multi-board panel. During subsequent translation of the loaded top shuttle to the routing station, a bottom shuttle transfers the first tray and liberated circuit boards to the load/unload station for unloading thereof. Elevators are provided at the load/unload station and the routing station for raising and lowering the trays as needed.

4 Claims, 3 Drawing Sheets

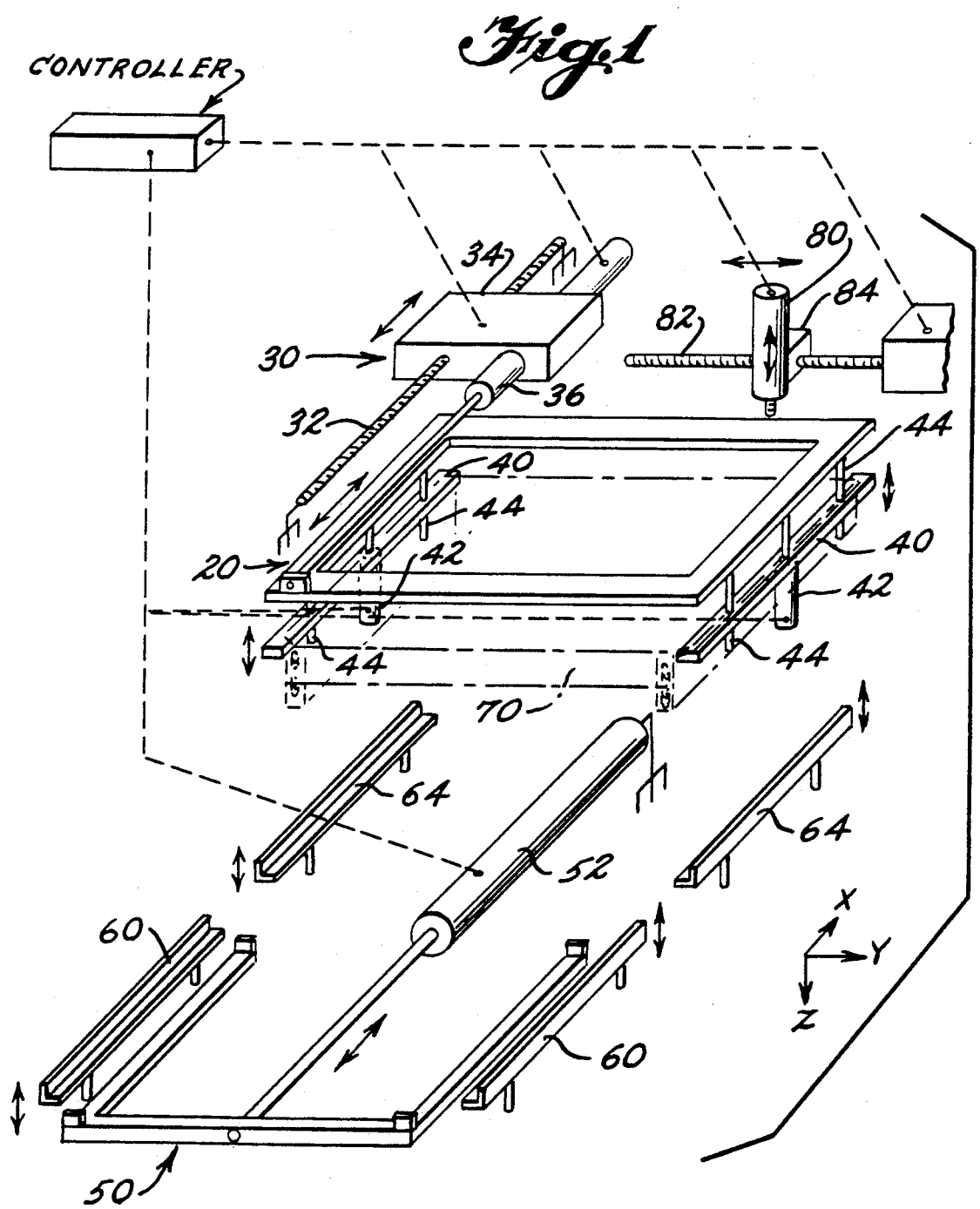

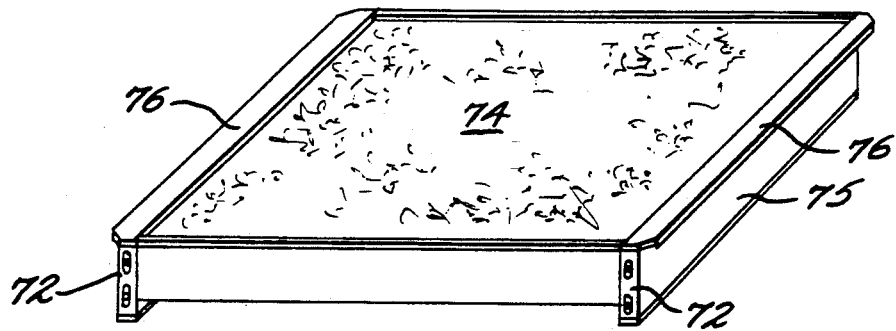
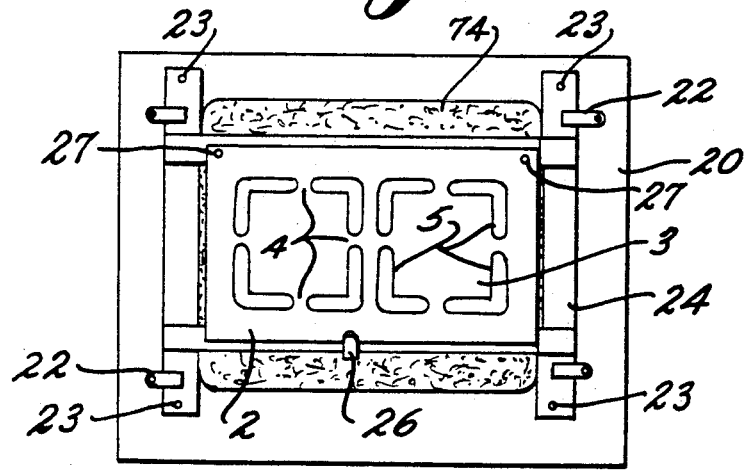
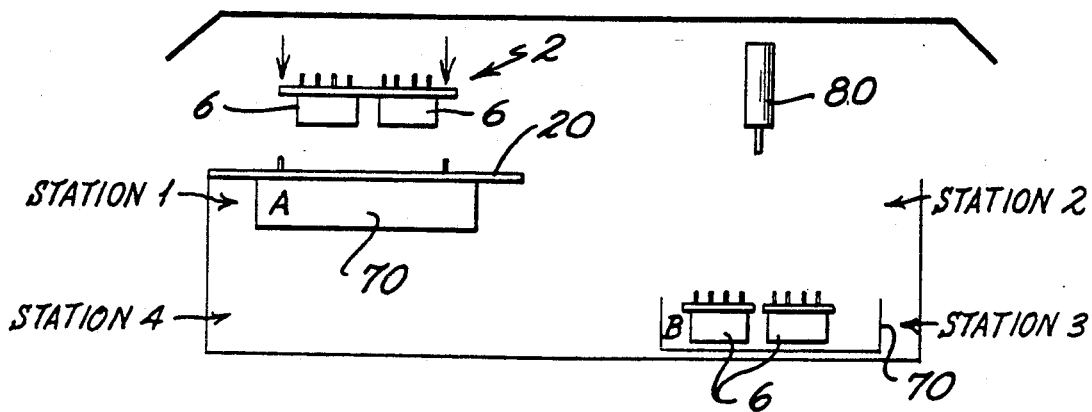

TAB ROUTING METHOD AND APPARATUS

This application is a continuation of U.S. application Ser. No. 07/44,337 filed Nov. 22, 1989, and now abandoned.

BACKGROUND AND SUMMARY OF THE INVENTION

The invention is in the field of article handling and, more particularly, deals with the handling of a multi-board panel made up on an array of printed circuit boards whose peripheries have been substantially routed from the panel leaving small unrouted webs or tabs to hold the boards in the panel. Such a multi-board panel is generally referred to in the industry as a slotted and webbed (or tabbed) array.

The invention deals specifically with routing the remaining tabs or webs to liberate individual circuit boards from the multi-board panel, as well as with handling of the substrate material in preparation for and after such liberation of the circuit boards.

SUMMARY OF THE INVENTION

A method and apparatus are disclosed for handling multi-board panels in order to liberate therefrom individual circuit boards which may or may not have been prepopulated with the electrical components. Each panel is supported above a receiving tray on a top shuttle and transported from a load/unload station to a routing station at which tabs or webs which retain the circuit boards in the panel are removed. The removal of the boards is facilitated by X-positioning of the panel and Y-positioning of the router according to a programmable controller. The tray receives liberated boards from the top shuttle whereupon this shuttle is returned to the load/unload station for unloading scrap, acquiring another tray, and reloading with another multi-board panel. During subsequent translation of the loaded top shuttle to the routing station, a bottom shuttle transfers the first tray and liberated circuit boards to the load/unload station for unloading thereof. Elevators are provided at the load/unload station and the routing station for raising and lowering the trays as needed.

BRIEF DESCRIPTION OF THE DRAWINGS

FIG. 1 is an isometric view of the basic mechanical parts of the inventive apparatus.

FIG. 2 is an isometric view of the tray used with the apparatus.

FIG. 3 is a top plan view depicting a multi-board panel mounted in the bracket of a top shuttle.

FIG. 4A-4D are schematics illustrating the general cycling of two trays simultaneously.

DETAILED DESCRIPTION OF THE INVENTION

Figure 4B:
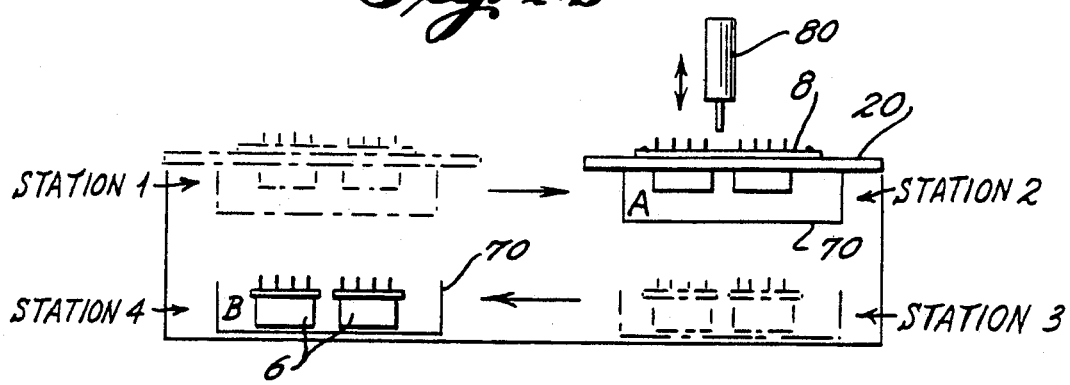

The major moveable mechanical parts of the apparatus are illustrated in FIG. 1. A bottom shuttle 50 is situated at the front elevator 60 and retractable to the rear elevator 64 by means of piston/cylinder 52 according to the commands of programmable controller 90. A top shuttle 20 is illustrated as retracted to the rear of the device and is extensible therefrom to the front of the device by means of piston/cylinder 36. A clamping mechanism is provided for clamping a tray 70 (illustrated in phantom in FIG. 1) to the bottom of shuttle 20 and comprises clamping bars 40 reciprocatable along guide rods 44 according to actuation of cylinders 42.

Referring to FIGS. 1 and 2, each tray 70 has side flanges 76 which rest on clamp bars 40 in preparation for raising to the clamped position on the bottom side of shuttle 20. The side flanges 76 are integral with downwardly projecting side portions 75 which act as feet to support the tray 70 on the front and rear elevators 60 and 64. As may be seen in FIG. 2, a pan portion of the tray 70 is adjustable in height relative to the feet 75 and flanges 76 by means of screws and slots at 72. Within the pan portion of each tray 70 is a foam pad insert 74 for a purpose yet to be described.

The piston/cylinder 36 for moving top shuttle back and forth between front and rear of the device is supported by a servo motor 34 which, in turn, is reciprocatable along a lead screw 32 which is parallel to the X axis of the orthogonal coordinate system illustrated in FIG. 1. Another servo motor 84 supports the router 80 for reciprocation along lead screw 82 which is parallel to the Y axis. Router 80 also has the facility for "plunge entry" into the work, preferably by raising and lowering lead screw 82 and its support generally in a direction parallel to the Z axis of the coordinate system.

Referring to FIG. 3, shuttle 20 is illustrated in top plan view and has a tray 70 clamped to the bottom thereof such that foam insert 74 is all that is seen of tray 70. Shuttle 20 has clips 22 and/or pins 23 by which a panel-holding bracket 24 is registratable on top of shuttle 20. Panel bracket 24, in turn, has a hold down clip 26 and pins 27 by which a panel 2 is mounted for subsequent routing. As may be seen from FIG. 3, panel 2 has been prerouted with slots 5 around the peripheries of two individual circuit boards 3 which remain attached to the overall panel 2 by means of tabs or webs 4. It is these tabs 4 which are to be removed by the apparatus of the invention in order to liberate the individual boards 3 from the panel 2.

GENERAL OPERATION

Figure 4C:
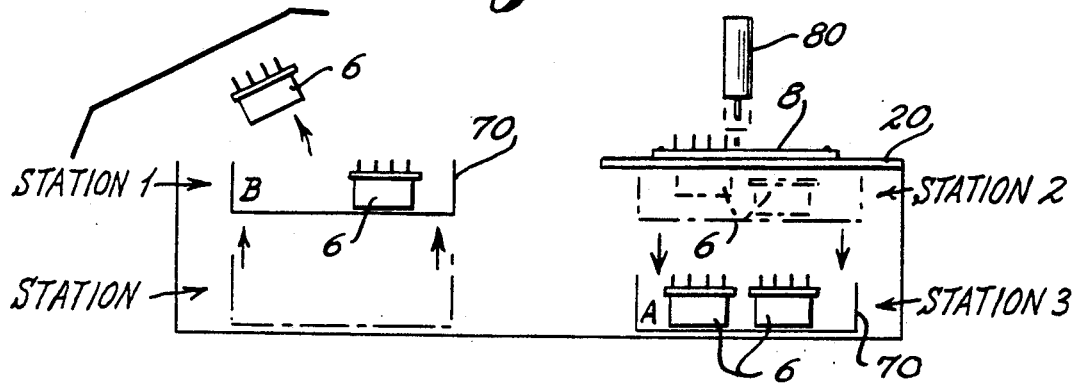
Figure 4D:
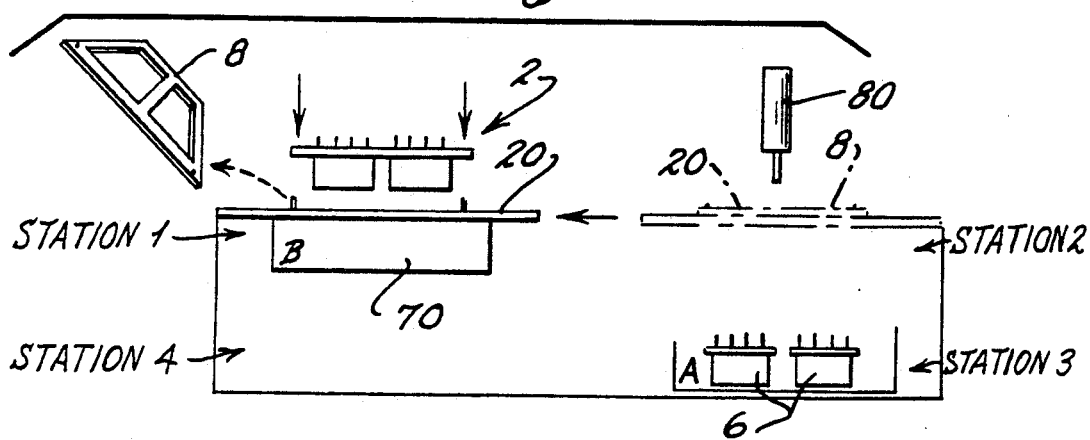

FIGS. 4A-4D schematically illustrate a sequence of events, in a general nature, which occur in operation of the device.

In step 1, the operator places a fully assembled panel upside down (component side down) on the top shuttle 20 which previously has had a tray A clamped to the bottom thereof.

In step 2, the operator presses the appropriate switches causing top shuttle 20 with tray A to move to the routing area simultaneously with movement in the opposite direction of tray B which is carrying panels 3 which were liberated previously by routing.

In step 3, the operator offloads or unloads the liberated panels 3 from tray B while routing is being performed on the panel supported above tray A by shuttle 20. During routing, the tabs 4 of each circuit board 3 are removed so that circuit board 3 drops into the tray A which is clamped to underside of the top shuttle 20 at the routing station. Thereafter, top shuttle 20 unclamps and leaves tray A and returns to the load/unload station to acquire and clamp tray B which has just been emptied by the operator. Once the top shuttle 20 has cleared the routing area, the tray situated thereat may be lowered and transferred to the load/unload station for removal of components.

In step 4, the scrap material 8 is removed from tray B and a new panel 2 is mounted in the panel bracket 24 of top shuttle 20.

DETAILED OPERATION

Referring to the Figures and assuming that half of a complete cycle of the machine has been run already, flanges 76 of the tray are clamped to the bottom of top shuttle 20 by clamping bars 40, tray B is situated at station 3 with the feet 75 thereof resting on bottom shuttle 50, and the front and rear elevators 60 and 64 are in their fully retracted positions at stations 4 and 3, respectively, so that they do not interfere with bottom shuttle 50.

At this time, the operator registers a multi-board panel 2 on the bracket 24 of top shuttle 20, with the panel 2 having been prepopulated with components 6 which protrude downwardly into tray A which is attached to shuttle 20. Upon starting the machine, piston/cylinder 36 is actuated to transfer shuttle 20 to station 2 at which the routing process will be performed. Bottom shuttle 50 is translated by piston/cylinder 52 to station 4 generally simultaneously with translation of the top shuttle 20 to station 2.

Once the piston/cylinder 36 has fully retracted, shuttle 20 is moveable in the X direction along lead screw 32 by actuation of servo motor 34, and router 80 is moveable in the Y direction along lead screw 82 by servo motor 84 until the router 80 is appropriately positioned relative to the plane of the multi-board panel 2, at which time the router 80 may be plunged in the Z direction into panel 2 so as to position the routing bit for tab removal. Controller controls the relative X, Y, and Z movements between the panel 2 and the router bit such that straight line and arcuate routing paths may be accomplished.

As the tabs which support each circuit board 3 in the multi-board panel 2 are removed, individual circuit boards 3 will be liberated from panel 2 and drop into tray A. During this processing, the front and rear elevators 60 and 64 are raised. Front elevator 60 lifts tray B from bottom shuttle 50 at station 4 and elevates it to station 1 with feet 75 of tray B supported on front elevator 60. Although rear elevator 64 also is raised, it does not interfere with tray A, which is clamped to the bottom of top shuttle 20, during the routing process.

The operator unloads previously liberated boards 3 from tray B at station 1 while the routing process takes place at station 2. Once the routing is completed at station 2, the cylinders 42 of top shuttle 20 are actuated to lower clamping bars 40 such that the flanges 76 are no longer clamped to the underside of top shuttle 20 and such that feet 75 of tray A rest on rear elevator 64 which was previously raised. At this time, top shuttle 20 is translated back to station 1 from station 2, without tray A, in order to acquire tray B, and while the empty bottom shuttle 50 is simultaneously translated back to station 3 from station 4.

Next, the front and rear elevators 60 and 64 are retracted. Tray A is lowered from station 2 to station 3. Flanges 76 of tray B are lowered onto clamping bars 40 of top shuttle 20 during lowering of front elevator 60 from station 1 to station 4.

While top shuttle 20 is at station 1, and prior to raising clamping bars 40, any scrap 8 which remains attached to bracket 24 is removed and discarded. Thereafter, a new multi-board panel 2 is loaded and registered onto bracket 24 of top shuttle 20 and clamping cylinders 42 are actuated to clamp tray B to the underside of top shuttle 20. Tray B is now where tray A was initially, and tray A now occupies the initial position of tray B.

This cycle is continued until all of the panels have been processed and all of the liberated boards have been removed from the machine.

In a prototype of the invention, a central processing unit comprises an IBM PC/XT compatible unit, with keyboard and monitor, for storing programs which coordinate machine operations providing diagnostic status information and providing for on-line programming. Servo motors 34 and 84 are high speed DC servo motors. The inserts 74 for each tray 70 are an anti-static foam material. In this regard, the anti-static foam top surface can be molded such that downwardly protruding components "nest" in the mold. It is also contemplated that the trays can be provided with holes and clamp bars 40 can be provided with corresponding pins registratable in such holes for exact positioning of the tray with respect to the shuttle during clamping.

The following claims are intended to cover all of the generic and specific features of the invention herein described and all statements of the scope of the invention which as a matter of language, might be said to fall therebetween.

Now that the invention has been described, we claim:

1. An apparatus for handling substrates, comprising:
    a shuttle by which a substrate and a tray are carried together from a load/unload station to a processing station and comprising means for receiving and maintaining at least one substrate on said shuttle, and means for receiving, loading an maintaining a tray on said shuttle in a vertically spaced apart relation to said substrate in preparation for processing at said processing station;
    means for transporting said shuttle back and forth between said load/unload station and said processing station;
    means for processing said substrate at said processing station and comprising means for liberating at least a portion of said substrate from said shuttle to said tray carried by said shuttle during said processing;
    means, situated at said processing station, for removing said tray from said shuttle;
    means for presenting another tray carrying another portion, which was previously liberated from another substrate, at said load/unload station for unloading of said other portion, and for positioning said another tray for reception and loading onto said shuttle at said load/unload station; and
    means for controlling cyclical movement of said shuttle, said tray removing means, and said other tray presenting and positioning means in order to cycle said trays and accomplish said processing of said substrates during said handling.

2. The apparatus as in claim 1, and further comprising:
    means for moving said shuttle relative to a processing tool in orthogonal X, Y, and Z directions, selectively, while said shuttle is at said processing station, in order to facilitate said processing.

3. The apparatus as in claim 1, wherein said means for receiving, loading and maintaining a tray on said shuttle comprises:
    a clamping means for supportingly receiving said tray by flanges of said tray and raising said tray by said flanges into clamping engagement with an underside of said shuttle 4. The apparatus as in claim 3, wherein:
    . said means for removing said tray from said shuttle comprises an elevator which is raisable into engagement with said tray, upon unclamping of said clamping means, to raise said tray sufficiently to disengage said flanges from support by said clamping means, such that said shuttle is moveable away from said processing station without said tray;

said another tray presenting and positioning means comprises another elevator raisable to allow sufficient clearance between flanges of said another tray and said clamping means for said shuttle during movement of said shuttle into said load/unload station; and another shuttle is shiftable back and forth between said stations in order to deliver trays with liberated portions therein from said processing station to said load/unload station.

* * * * *